(12) United States Patent
Mizukami

(10) Patent No.: US 12,088,353 B2
(45) Date of Patent: Sep. 10, 2024

(54) POWER-OVER-FIBER SYSTEM

(71) Applicant: KYOCERA CORPORATION, Kyoto (JP)

(72) Inventor: Tatsuo Mizukami, Yokohama (JP)

(73) Assignee: KYOCERA CORPORATION, Kyoto (JP)

( * ) Notice: Subject to any disclaimer, the term of this patent is extended or adjusted under 35 U.S.C. 154(b) by 0 days.

(21) Appl. No.: 17/754,898

(22) PCT Filed: Jun. 18, 2020

(86) PCT No.: PCT/JP2020/023915
§ 371 (c)(1),
(2) Date: Apr. 15, 2022

(87) PCT Pub. No.: WO2021/075087
PCT Pub. Date: Apr. 22, 2021

(65) Prior Publication Data
US 2024/0129046 A1  Apr. 18, 2024

(30) Foreign Application Priority Data

Oct. 18, 2019 (JP) .................................. 2019-190639

(51) Int. Cl.
*H04B 10/80* (2013.01)
*H01S 5/068* (2006.01)
*H02J 50/30* (2016.01)

(52) U.S. Cl.
CPC ....... *H04B 10/808* (2013.01); *H01S 5/06804* (2013.01); *H02J 50/30* (2016.02)

(58) Field of Classification Search
CPC ..... H04B 10/808; H02J 50/30; H01S 5/06804

USPC .......................................................... 398/171
See application file for complete search history.

(56) References Cited

U.S. PATENT DOCUMENTS

2009/0016715 A1* 1/2009 Furey ................... H04B 10/807
398/38

FOREIGN PATENT DOCUMENTS

| JP | 10-510418 | A | * | 10/1998 | .............. H02J 17/00 |
| JP | H10510418 | A |  | 10/1998 |  |
| JP | 2010135989 | A |  | 6/2010 |  |
| WO | 2011142819 | A2 |  | 11/2011 |  |

(Continued)

*Primary Examiner* — Mohammad R Sedighian
(74) *Attorney, Agent, or Firm* — HAUPTMAN HAM, LLP

(57) ABSTRACT

A power-over-fiber system includes a power sourcing equipment, a powered device, and an optical fiber cable. The power sourcing equipment includes a semiconductor laser that oscillates with electric power to output feed light. The powered device includes a photoelectric conversion element that converts the feed light from the power sourcing equipment into electric power. The optical fiber cable transmits the feed light from the power sourcing equipment to the powered device. The power-over-fiber system includes a temperature sensor that detects a temperature in the power sourcing equipment. When the temperature detected by the temperature sensor is equal to or higher than a predetermined threshold, a process of decreasing electric power input to the semiconductor laser is performed. When the temperature detected by the temperature sensor is lower than the predetermined threshold, a process of increasing electric power input to the semiconductor laser is performed.

5 Claims, 5 Drawing Sheets

(56) References Cited

FOREIGN PATENT DOCUMENTS

WO 2018042034 A1 3/2018

* cited by examiner

POWER-OVER-FIBER SYSTEM

RELATED APPLICATIONS

The present application is a National Phase of International Application No. PCT/JP2020/023915 filed Jun. 18, 2020, which claims priority to Japanese Application No. 2019-190639, filed Oct. 18, 2019.

TECHNICAL FIELD

The present disclosure relates to optical power supply.

BACKGROUND ART

Recently, there has been studied an optical power supply system that converts electric power into light (called feed light), transmits the feed light, converts the feed light into electric energy, and uses the electric energy as electric power.

PTL 1 discloses an optical communication device including an optical transmitter, an optical fiber, and an optical receiver. The optical transmitter transmits signal light modulated based on an electric signal and feed light for supplying electric power. The optical fiber includes a core, a first cladding surrounding the core, and a second cladding surrounding the first cladding. The core transmits the signal light. The first cladding has a refractive index lower than that of the core and transmits the feed light. The second cladding has a refractive index lower than that of the first cladding. The optical receiver operates with electric power obtained by converting the feed light transmitted through the first cladding of the optical fiber and converts the signal light transmitted through the core of the optical fiber into the electric signal.

CITATION LIST

Patent Literature

PTL 1: Japanese Unexamined Patent Application Publication No. 2010-135989

SUMMARY OF INVENTION

Technical Problem

In a power-over-fiber system, an optical transmitter, which is a power sourcing equipment, supplies electric power to an optical receiver, which is a powered device. To do so, the optical transmitter converts certain electric power into feed light. At that time, if the conversion efficiency is low, the optical transmitter may generate heat and the temperature in the optical transmitter may increase to be a high temperature. The optical transmitter includes an E/O conversion element (semiconductor laser element). A light output of the E/O conversion element decreases as the temperature increases. The life of the E/O conversion element decreases when the E/O conversion element is used in a high-temperature environment. Thus, suppressing an increase in temperature in the optical transmitter is desired.

Solution to Problem

A power-over-fiber system according to one aspect of the present disclosure is
a power-over-fiber system including a power sourcing equipment including a semiconductor laser that oscillates with electric power to output feed light, a powered device including a photoelectric conversion element that converts the feed light from the power sourcing equipment into electric power, and an optical fiber cable that transmits the feed light from the power sourcing equipment to the powered device.
The power-over-fiber system includes
a temperature sensor that detects a temperature in the power sourcing equipment, and
a controller that performs a process of switching electric power input to the semiconductor laser, based on the temperature detected by the temperature sensor.

In addition, a power-over-fiber system according to one aspect of the present disclosure is
a power-over-fiber system including a power sourcing equipment including a semiconductor laser that oscillates with electric power to output feed light, a powered device including a photoelectric conversion element that converts the feed light from the power sourcing equipment into electric power, and an optical fiber cable that transmits the feed light from the power sourcing equipment to the powered device.
The power-over-fiber system includes
a temperature sensor that detects a temperature in the power sourcing equipment, and
a controller that performs a process of decreasing electric power input to the semiconductor laser when the temperature detected by the temperature sensor is equal to or higher than a predetermined threshold and a process of increasing electric power input to the semiconductor laser when the temperature is lower than the predetermined threshold.

In addition, the power-over-fiber system includes
a first data communication device including the power sourcing equipment, and a second data communication device including the powered device. The second data communication device performs optical communication with the first data communication device.

The controller includes a power-sourcing-side controller included in the first data communication device, and a powered-side controller included in the second data communication device. The power-sourcing-side controller performs a process of switching electric power input to the semiconductor laser, based on temperature information obtained by the temperature sensor through detection, and a process of notifying the second data communication device, by the optical communication, of feed light switching information indicating that an output level of the feed light output by the semiconductor laser is to be switched in response to switching of the electric power input to the semiconductor laser that is performed based on the temperature information. The powered-side controller performs a process of switching an operation mode of the second data communication device, based on the notified feed light switching information.

DESCRIPTION OF EMBODIMENTS

One embodiment of the present disclosure is described below with reference to the drawings.
(1) Overview of System

First Embodiment

Figure 1:
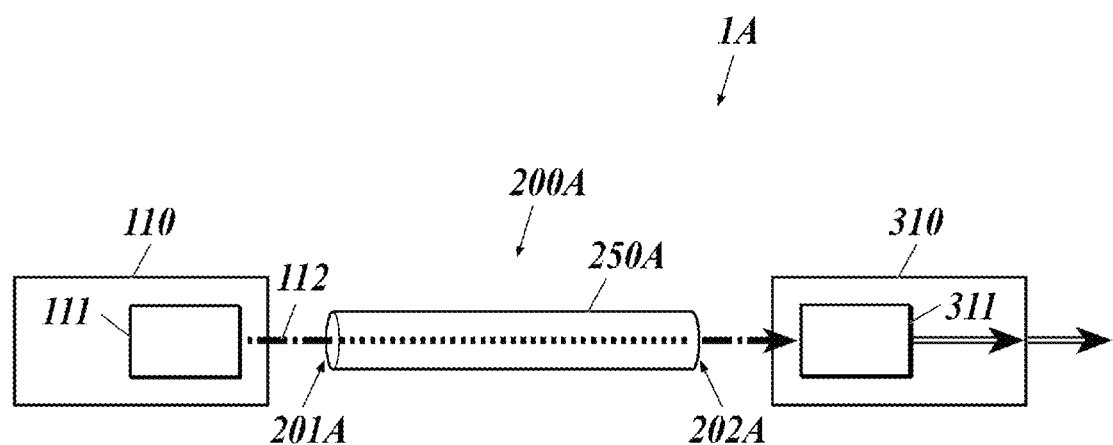
FIG. 1 is a diagram illustrating a configuration of a power-over-fiber system according to a first embodiment of the present disclosure.

As illustrated in FIG. 1, a power-over-fiber (PoF) system 1A according to the present embodiment includes a power sourcing equipment (PSE) 110, an optical fiber cable 200A, and a powered device (PD) 310.

In the present disclosure, the power sourcing equipment is a device that converts electric power into optical energy and supplies the optical energy, and the powered device is a device that receives the supplied optical energy and converts the optical energy into electric power.

The power sourcing equipment 110 includes a semiconductor laser 111 for power supply.

The optical fiber cable 200A includes an optical fiber 250A that forms a channel of feed light.

The powered device 310 includes a photoelectric conversion element 311.

The power sourcing equipment 110 is connected to a power source, which electrically drives the semiconductor laser 111 for power supply and so on.

The semiconductor laser 111 for power supply oscillates with electric power supplied from the power source to output feed light 112.

The optical fiber cable 200A has one end 201A connectable to the power sourcing equipment 110 and another end 202A connectable to the powered device 310, and transmits the feed light 112.

The feed light 112 from the power sourcing equipment 110 is input to the one end 201A of the optical fiber cable 200A. The feed light 112 propagates through the optical fiber 250A and is output from the other end 202A to the powered device 310.

The photoelectric conversion element 311 converts the feed light 112 transmitted through the optical fiber cable 200A into electric power. The electric power obtained by the photoelectric conversion element 311 through the conversion is used as driving electric power needed in the powered device 310. The powered device 310 is capable of outputting, for an external device, the electric power obtained by the photoelectric conversion element 311 through the conversion.

Semiconductor materials of semiconductor regions that exhibit a light-electricity conversion effect of the semiconductor laser 111 for power supply and the photoelectric conversion element 311 are semiconductors having a short laser wavelength of 500 nm or shorter.

Semiconductors having a short laser wavelength have a large band gap and a high photoelectric conversion efficiency. Thus, the photoelectric conversion efficiency on the power-generating side and the powered-side of optical power supply improves, and the optical power supply efficiency improves.

Therefore, as such semiconductor materials, for example, semiconductor materials that are laser media having a laser wavelength (fundamental wave) of 200 to 500 nm such as diamond, gallium oxide, aluminum nitride, and gallium nitride may be used.

As the semiconductor materials, semiconductors having a band gap of 2.4 eV or greater are used.

For example, semiconductor materials that are laser media having a band gap of 2.4 to 6.2 eV such as diamond, gallium oxide, aluminum nitride, and gallium nitride may be used.

Laser light having a longer wavelength tends to have a higher transmission efficiency. Laser light having a shorter wavelength tends to have a higher photoelectric conversion efficiency. Thus, in the case of long-distance transmission, a semiconductor material that is a laser medium having a laser wavelength (fundamental wave) longer than 500 nm may be used. When the photoelectric conversion efficiency is prioritized, a semiconductor material that is a laser medium having a laser wavelength (fundamental wave) shorter than 200 nm may be used.

These semiconductor materials may be used in either the semiconductor laser 111 for power supply or the photoelectric conversion element 311. The photoelectric conversion efficiency is improved on the power-sourcing side or the powered side, and consequently the optical power supply efficiency improves.

Second Embodiment

Figure 2:
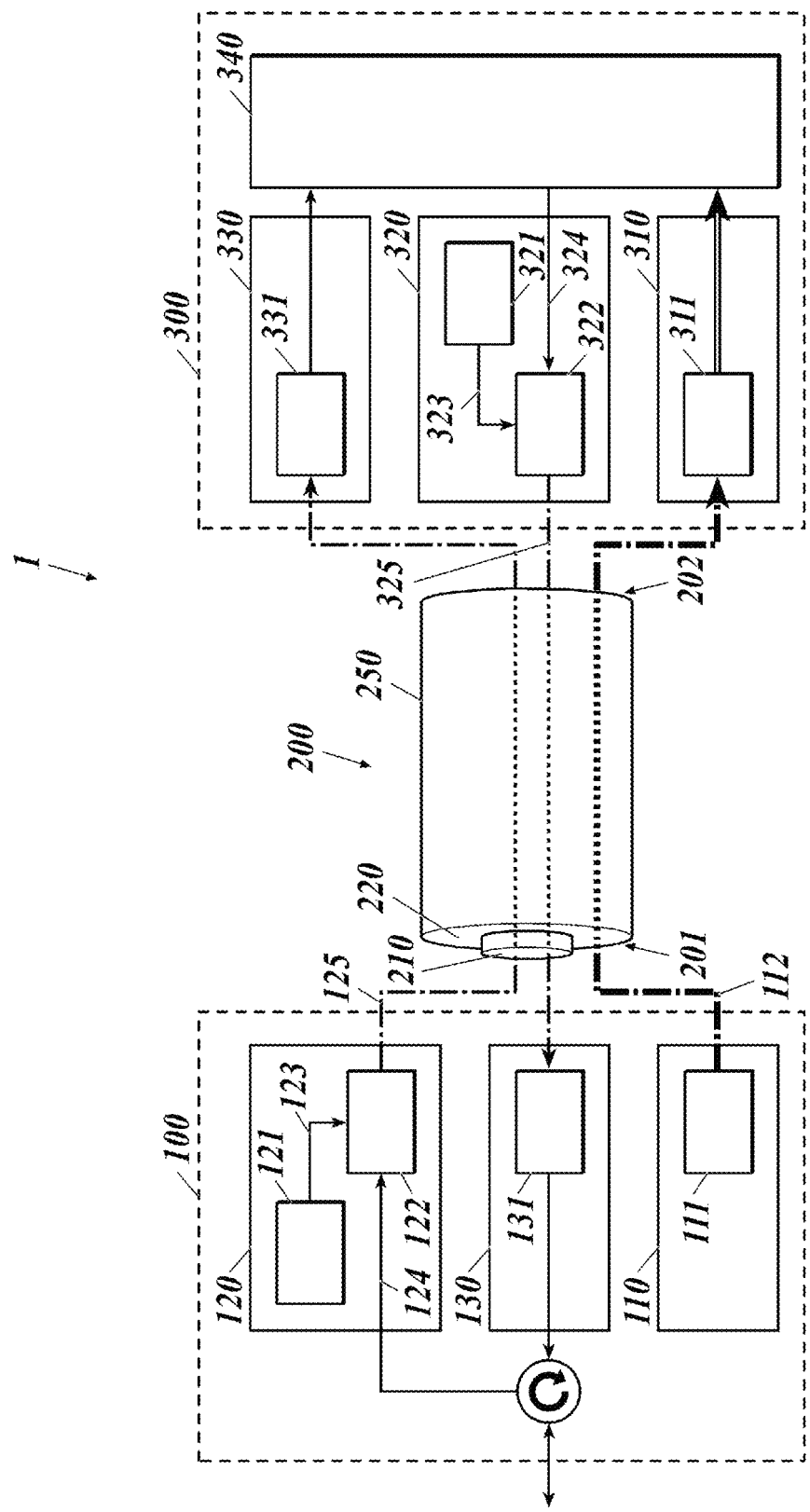
FIG. 2 is a diagram illustrating a configuration of a power-over-fiber system according to a second embodiment of the present disclosure.

As illustrated in FIG. 2, a power-over-fiber (PoF) system 1 according to the present embodiment is a system including a power supply system and an optical communication system with an optical fiber. Specifically, the power-over-fiber system 1 includes a first data communication device 100 including a power sourcing equipment (PSE) 110, an optical fiber cable 200, and a second data communication device 300 including a powered device (PD) 310.

The power sourcing equipment 110 includes a semiconductor laser 111 for power supply. The first data communication device 100 includes, in addition to the power sourcing equipment 110, a transmitter 120 and a receiver 130 that perform data communication. The first data communication device 100 corresponds to a data terminal equipment (DTE), a repeater, or the like. The transmitter 120 includes a semiconductor laser 121 for signals and a modulator 122. The receiver 130 includes a photodiode 131 for signals.

The optical fiber cable 200 includes an optical fiber 250 including a core 210 and a cladding 220. The core 210 forms a channel of signal light. The cladding 220 is arranged to surround the core 210 and forms a channel of feed light.

The powered device 310 includes a photoelectric conversion element 311. The second data communication device 300 includes, in addition to the powered device 310, a transmitter 320, a receiver 330, and a data processor 340. The second data communication device 300 corresponds to a power end station or the like. The transmitter 320 includes a semiconductor laser 321 for signals and a modulator 322. The receiver 330 includes a photodiode 331 for signals. The data processor 340 is a unit that processes a received signal. The second data communication device 300 is a node in a communication network. Alternatively, the second data communication device 300 may be a node that communicates with another node.

The first data communication device 100 is connected to a power source, which electrically drives the semiconductor laser 111 for power supply, the semiconductor laser 121 for signals, the modulator 122, the photodiode 131 for signals, and so on. The first data communication device 100 is a node in the communication network. Alternatively, the first data communication device 100 may be a node that communicates with another node.

The semiconductor laser 111 for power supply oscillates with electric power supplied from the power source to output feed light 112.

The photoelectric conversion element 311 converts the feed light 112 transmitted through the optical fiber cable 200 into electric power. The electric power obtained by the photoelectric conversion element 311 through the conversion is used as driving electric power for the transmitter 320, the receiver 330, and the data processor 340 and as other driving electric power needed in the second data communication device 300. The second data communication device 300 may be capable of outputting, for an external device, the electric power obtained by the photoelectric conversion element 311 through the conversion.

On the other hand, the modulator 122 of the transmitter 120 modulates laser light 123 output from the semiconductor laser 121 for signals into signal light 125 on the basis of transmission data 124, and outputs the signal light 125.

The photodiode 331 for signals of the receiver 330 demodulates the signal light 125 transmitted through the optical fiber cable 200 into an electric signal, and outputs the electric signal to the data processor 340. The data processor 340 transmits data based on the electric signal to a node. The data processor 340 also receives data from the node, and outputs, as transmission data 324, the data to the modulator 322.

The modulator 322 of the transmitter 320 modulates laser light 323 output from the semiconductor laser 321 for signals into signal light 325 on the basis of the transmission data 324, and outputs the signal light 325.

The photodiode 131 for signals of the receiver 130 demodulates the signal light 325 transmitted through the optical fiber cable 200 into an electric signal, and outputs the electric signal. Data based on the electric signal is transmitted to a node. Data from the node is treated as the transmission data 124.

The feed light 112 and the signal light 125 output from the first data communication device 100 are input to one end 201 of the optical fiber cable 200. The feed light 112 and the signal light 125 propagate through the cladding 220 and the core 210, respectively, and are output from another end 202 of the optical fiber cable 200 to the second data communication device 300.

The signal light 325 output from the second data communication device 300 is input to the other end 202 of the optical fiber cable 200, propagates through the core 210, and is output from the one end 201 of the optical fiber cable 200 to the first data communication device 100.

Figure 3:
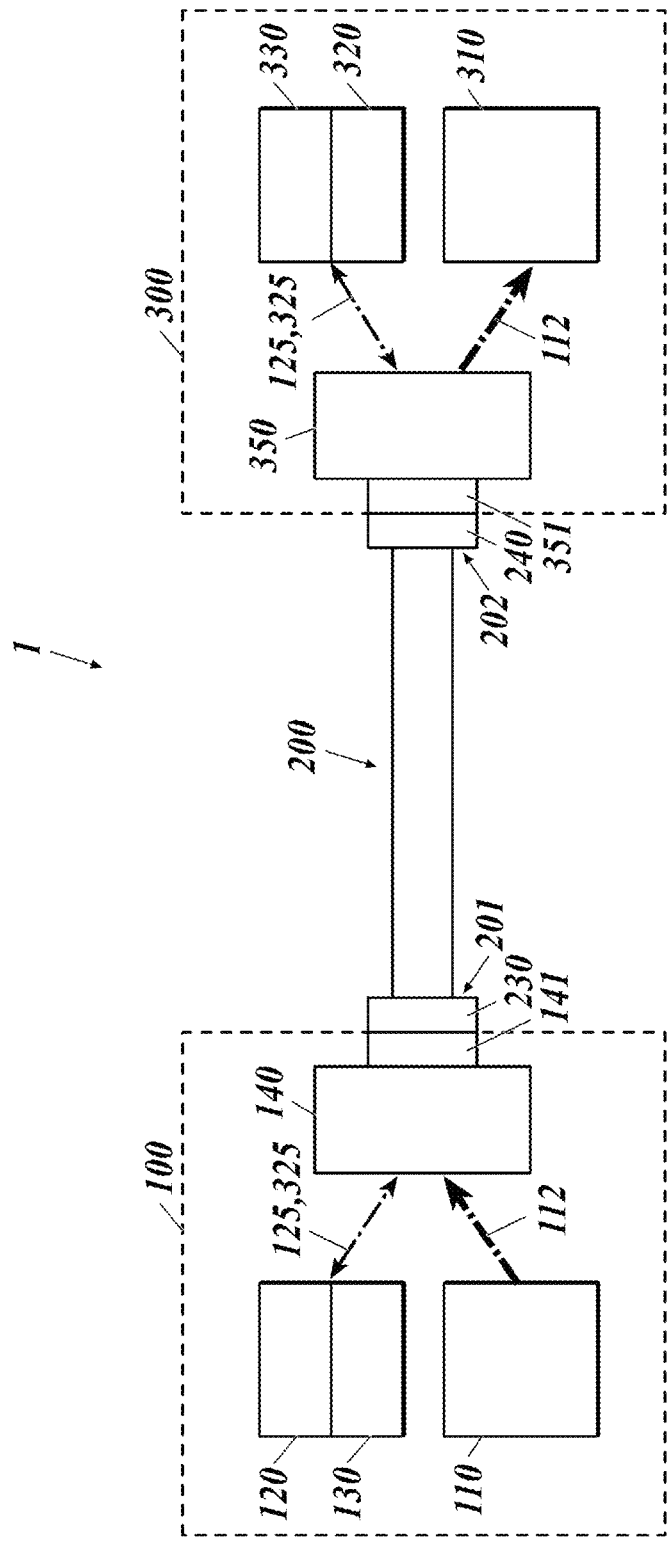
FIG. 3 is a diagram illustrating the configuration of the power-over-fiber system according to the second embodiment of the present disclosure, and illustrates optical connectors, etc.

As illustrated in FIG. 3, the first data communication device 100 includes a light input/output part 140 and an optical connector 141 attached to the light input/output part 140. In addition, the second data communication device 300 includes a light input/output part 350 and an optical connector 351 attached to the light input/output part 350. An optical connector 230 at the one end 201 of the optical fiber cable 200 is connected to the optical connector 141. An optical connector 240 at the other end 202 of the optical fiber cable 200 is connected to the optical connector 351. The light input/output part 140 guides the feed light 112 to the cladding 220, guides the signal light 125 to the core 210, and guides the signal light 325 to the receiver 130. The light input/output part 350 guides the feed light 112 to the powered device 310, guides the signal light 125 to the receiver 330, and guides the signal light 325 to the core 210.

As described above, the optical fiber cable 200 has the one end 201 connectable to the first data communication device 100 and the other end 202 connectable to the second data communication device 300, and transmits the feed light 112. Further, in the present embodiment, the optical fiber cable 200 transmits the signal light 125 and the signal light 325 bidirectionally.

As semiconductor materials of semiconductor regions that exhibit a light-electricity conversion effect of the semiconductor laser 111 for power supply and the photoelectric conversion element 311, same and/or similar materials as those mentioned in the first embodiment may be used, so that a high optical power supply efficiency is implemented.

Figure 4:
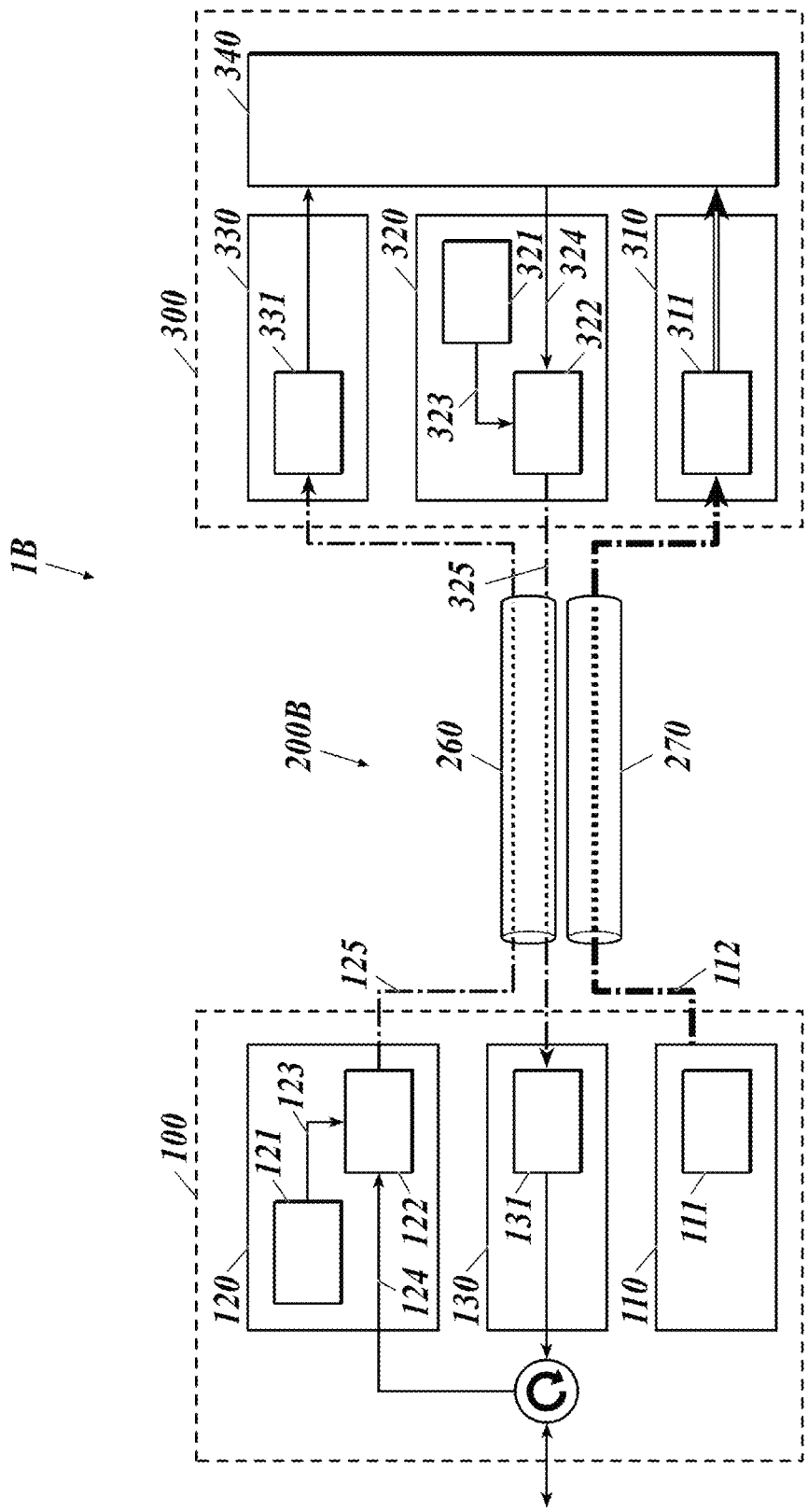
FIG. 4 is a diagram illustrating a configuration of a power-over-fiber system according to another embodiment of the present disclosure.

As in an optical fiber cable 200B of a power-over-fiber system 1B illustrated in FIG. 4, an optical fiber 260 that transmits signal light and an optical fiber 270 that transmits feed light may be provided separately. The optical fiber cable 200B may be constituted by a plurality of optical fiber cables.

(2) Regarding Switching of Output Level of Feed Light in Response to Switching of Electric Power Input to Semiconductor Laser for Power Supply Next, description is given of a process for switching electric power input to the semiconductor laser 111 for power supply of the power sourcing equipment 110 in accordance with a change in temperature in the power sourcing equipment 110 to switch an output level of the feed light 112 output from the semiconductor laser 111 for power supply.

First Example

Figure 5:
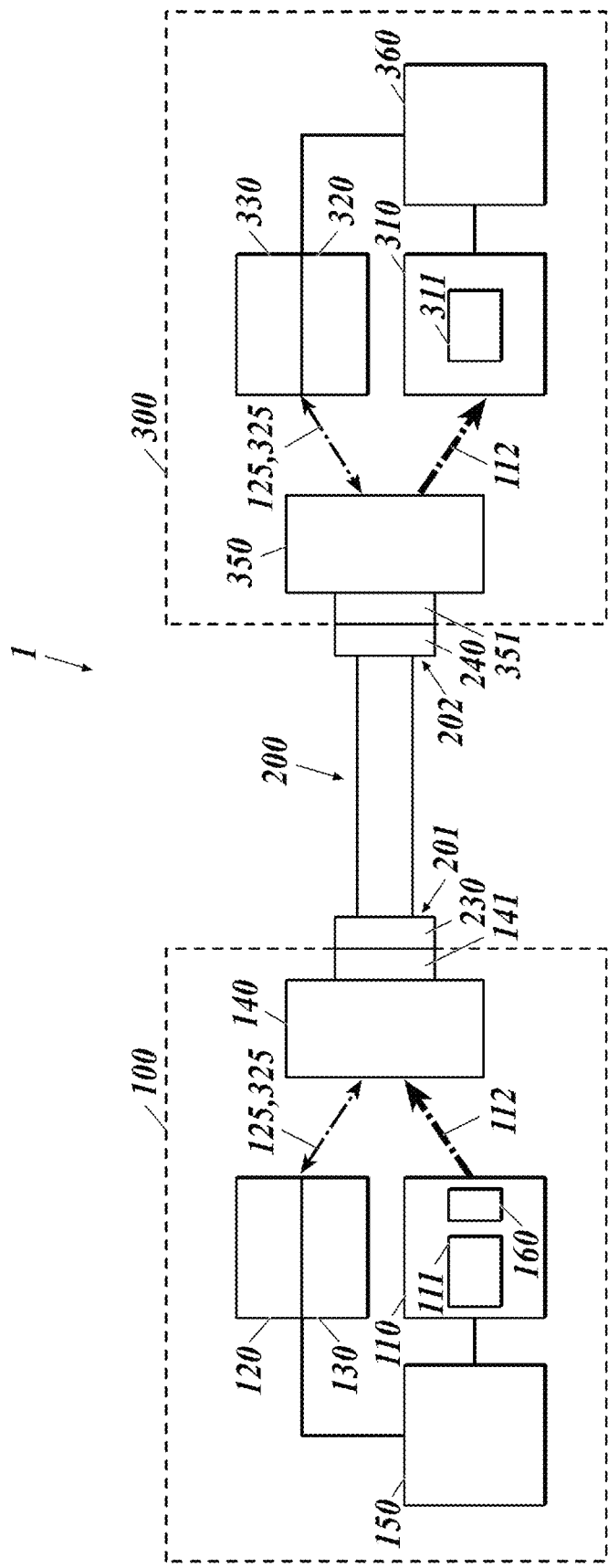
FIG. 5 is a diagram illustrating the configuration of the power-over-fiber system according to the second embodiment of the present disclosure, and additionally illustrates a controller (a powered-side controller and a power-sourcing-side controller).

The power-over-fiber system 1 illustrated in FIG. 5 includes the first data communication device 100 including the power sourcing equipment 110, the second data communication device 300 including the powered device 310, and the optical fiber cable 200 through which the first data communication device 100 and the second data communication device 300 perform optical communication.

As illustrated in FIG. 5, the power sourcing equipment 110 included in the first data communication device 100 includes a temperature sensor 160 that detects a temperature in the power sourcing equipment 110.

The first data communication device 100 also includes a power-sourcing-side controller 150. The power-sourcing-side controller 150 performs a process of switching electric power input to the semiconductor laser 111 for power supply on the basis of the temperature (temperature information) detected by the temperature sensor 160. The power-sourcing-side controller 150 also performs a process of notifying the second data communication device 300, by optical communication, of feed light switching information indicating that the output level of the feed light 112 output by the semiconductor laser 111 for power supply is to be switched in response to the switching of the electric power input to the semiconductor laser 111 for power supply on the basis of the temperature (temperature information) detected by the temperature sensor 160.

The second data communication device 300 includes a powered-side controller 360 that performs a process of switching an operation mode of the second data communication device 300 on the basis of the feed light switching information which the second data communication device 300 is notified of by the power-sourcing-side controller 150.

The power-sourcing-side controller 150 and the powered-side controller 360 operate in cooperation with each other to function as a controller. The controller performs a process of decreasing electric power input to the semiconductor laser 111 for power supply when the temperature detected by the temperature sensor 160 is equal to or higher than a predetermined threshold and of increasing electric power input to the semiconductor laser 111 for power supply when the temperature detected by the temperature sensor 160 is lower than the predetermined threshold. The controller also performs a process of switching the operation mode of the second data communication device 300 in response to switching of the output level of the feed light 112 output by the semiconductor laser 111 for power supply that is performed in response to the switching of electric power input to the semiconductor laser 111 for power supply.

As a temperature serving as the threshold, a temperature suitable for the semiconductor laser 111 for power supply to efficiently convert electric power input the feed light 112 or a temperature at which the semiconductor laser 111 for power supply can convert electric power into the feed light 112 without overheating is set.

For example, the power-sourcing-side controller 150 performs a process of acquiring the temperature information obtained by the temperature sensor 160 through the detection, determining whether to decrease or increase electric power input to the semiconductor laser 111 for power supply on the basis of the acquired temperature information, and switching the electric power input to the semiconductor laser 111 for power supply to switch the output level of the feed light 112 output by the semiconductor laser 111 for power supply.

In addition, the power-sourcing-side controller 150 performs a process of notifying the second data communication device 300, by optical communication, of the feed light switching information indicating that the output level of the feed light 112 output by the semiconductor laser 111 for power supply is to be switched on the basis of the acquired temperature information. The powered-side controller 360 performs a process of switching the operation mode of the second data communication device 300 on the basis of the notified feed light switching information.

Specifically, the power-sourcing-side controller 150 performs a process of decreasing electric power input to the semiconductor laser 111 for power supply to decrease the output level of the feed light 112 output by the semiconductor laser 111 for power supply when the temperature detected by the temperature sensor 160 is equal to or higher than the predetermined threshold, and performs a process of increasing electric power input to the semiconductor laser 111 for power supply to increase the output level of the feed light 112 output by the semiconductor laser 111 for power supply when the temperature detected by the temperature sensor 160 is lower than the predetermined threshold.

The power-sourcing-side controller 150 also performs a process of notifying the second data communication device 300 of the feed light switching information indicating that the output level of the feed light 112 output by the semiconductor laser 111 for power supply is to be switched (in this example, feed light switching information indicating that the output level of the feed light 112 is to decrease or feed light switching information indicating that the output level of the feed light 112 is to increase). The powered-side controller 360 performs a process of switching, on the basis of the notified feed light switching information, the operation mode of the second data communication device 300 to a low electric power mode (eco mode) in which the second data communication device 300 operates with a relatively low electric power when the output level of the feed light 112 output by the semiconductor laser 111 for power supply decreases and to a high electric power mode (normal mode) in which the second data communication device 300 operates with a relatively high electric power when the output level of the feed light 112 output by the semiconductor laser 111 for power supply increases.

For example, when a predetermined high electric power (for example, 400 W) is input to the semiconductor laser 111 for power supply under control of the power-sourcing-side controller 150, the semiconductor laser 111 for power supply outputs the feed light 112 of a high output level corresponding to the high electric power. When a predetermined low electric power (for example, 200 W) is input to the semiconductor laser 111 for power supply under the control of the power-sourcing-side controller 150, the semiconductor laser 111 for power supply outputs the feed light 112 of a low output level corresponding to the low electric power.

When the feed light 112 of the high output level is input to the photoelectric conversion element 311 of the powered device 310, the photoelectric conversion element 311 converts the feed light 112 into a relatively high electric power. When the feed light 112 of the low output level is input to the photoelectric conversion element 311 of the powered device 310, the photoelectric conversion element 311 converts the feed light 112 into a relatively low electric power.

When the temperature in the power sourcing equipment 110 detected by the temperature sensor 160 is equal to or higher than a predetermined threshold, the power-sourcing-side controller 150 switches electric power input to the semiconductor laser 111 for power supply to a predetermined low electric power to decrease the output level of the feed light 112 output by the semiconductor laser 111 for power supply.

In this manner, heat generated when the semiconductor laser 111 for power supply converts the electric power into the feed light 112 is suppressed. Consequently, an increase in temperature in the power sourcing equipment 110 can be suppressed.

At this time, on the basis of the feed light switching information indicating that the output level of the feed light 112 output by the semiconductor laser 111 for power supply is to decrease, the second data communication device 300 is switched to the low electric power mode (eco mode) in which the second data communication device 300 operates with a relatively low electric power (for example, 100 W). Thus, the second data communication device 300 operates in accordance with the low electric power.

On the other hand, when the temperature in the power sourcing equipment 110 detected by the temperature sensor 160 is lower than the predetermined threshold, the power-sourcing-side controller 150 switches electric power input to the semiconductor laser 111 for power supply to a predetermined high electric power to increase the output level of the feed light 112 output by the semiconductor laser 111 for power supply.

In this manner, when the temperature in the power sourcing equipment 110 is lower than the predetermined threshold, the feed light 112 of a higher output level is transmitted to the powered device 310 of the second data communication device 300.

At this time, on the basis of the feed light switching information indicating that the output level of the feed light 112 output by the semiconductor laser 111 for power supply is to increase, the second data communication device 300 is switched to the high electric power mode (normal mode) in which the second data communication device 300 operates with a relatively high electric power (for example, 200 W). Thus, the second data communication device 300 operates in accordance with the high electric power.

Therefore, when the temperature in the power sourcing equipment 110 detected by the temperature sensor 160 is equal to or higher than the predetermined threshold, the electric power input to the semiconductor laser 111 for power supply is switched to the predetermined low electric power to decrease heat generated when the semiconductor laser 111 for power supply converts the electric power into the feed light 112. Thus, an increase in temperature in the power sourcing equipment 110 is suppressed.

In addition, when the temperature in the power sourcing equipment 110 detected by the temperature sensor 160 is lower than the predetermined threshold, the electric power input to the semiconductor laser 111 for power supply is switched to the predetermined high electric power to increase the output level of the feed light 112 output by the semiconductor laser 111 for power supply. Thus, the feed light 112 of a higher output level is transmitted to the powered device 310 of the second data communication device 300.

That is, when the temperature in the power sourcing equipment 110 is equal to or higher than the predetermined threshold, the electric power input to the semiconductor laser 111 for power supply is switched to the predetermined low electric power to decrease heat generated when the semiconductor laser 111 for power supply converts the electric power into the feed light 112 and thus suppress an increase in temperature in the power sourcing equipment 110, thereby decreasing the temperature in the power sourcing equipment 110.

If the temperature in the power sourcing equipment 110 becomes lower than the predetermined threshold after a predetermined time or the like, the electric power input to the semiconductor laser 111 for power supply is switched to the predetermined high electric power to transmit the feed light 112 of a higher output level to the powered device 310, thereby allowing the second data communication device 300 to operate suitably.

As described above, by switching the electric power input to the semiconductor laser 111 for power supply in accordance with the temperature in the power sourcing equipment 110 detected by the temperature sensor 160 to switch the output level of the feed light 112 output by the semiconductor laser 111 for power supply, an increase in temperature in the power sourcing equipment 110 can be suppressed and the second data communication device 300 can operate in an operation mode corresponding to the output level of the feed light 112 output by the semiconductor laser 111 for power supply.

In particular, even if the temperature in the power sourcing equipment 110 increases to be equal to or higher than the predetermined threshold because of heat generated when the semiconductor laser 111 for power supply converts the electric power into the feed light 112, the electric power input to the semiconductor laser 111 for power supply is switched to the predetermined low electric power to decrease heat generated when the semiconductor laser 111 for power supply converts the electric power into the feed light 112. In this manner, an increase in temperature in the power sourcing equipment 110 can be suppressed.

The semiconductor laser 111 for power supply is an element for which the light output of the feed light 112 decreases as the temperature increases. Thus, by suppressing an increase in temperature in the power sourcing equipment 110, the light output of the semiconductor laser 111 for power supply can be stabilized.

In addition, the semiconductor laser 111 for power supply is an element unsuitable for the use in a high temperature environment. Thus, by suppressing an increase in temperature in the power sourcing equipment 110 to suppress deterioration of the semiconductor laser 111 for power supply, the light output of the semiconductor laser 111 for power supply can be stabilized for a long period.

The temperature in the power sourcing equipment 110 may increase because of heat generated when the semiconductor laser 111 for power supply converts electric power into the feed light 112. The temperature in the power sourcing equipment 110 may also increase when an outdoor air temperature in an environment where the power-over-fiber system 1 including the power sourcing equipment 110 (the first data communication device 100) is installed is high.

Even if the temperature in the power sourcing equipment 110 increases to be equal to or higher than the predetermined threshold because of the outdoor air temperature, by switching the electric power input to the semiconductor laser 111 for power supply to the predetermined low electric power to decrease heat generated when the semiconductor laser 111 for power supply converts the electric power into the feed light 112, an increase in temperature in the power sourcing equipment 110 can be suppressed.

Second Example

In the embodiment described above (first example), the configuration has been described in which the electric power input to the semiconductor laser 111 for power supply is switched on the basis of the temperature in the power sourcing equipment 110 detected by the temperature sensor 160 to switch the output level of the feed light 112 output by the semiconductor laser 111 for power supply and in which the operation mode of the second data communication device 300 is switched in response to the switching of the output level of the feed light 112 output by the semiconductor laser 111 for power supply. However, the present invention is not limited to such a configuration.

For example, the powered-side controller 360 of the second data communication device 300 performs a process of switching the operation mode of the second data communication device 300 on the basis of the feed light switching information which the second data communication device 300 is notified of by the power-sourcing-side controller 150, and performs a process of notifying the power-sourcing-side controller 150, by optical communication, of response information indicating that the operation mode has been switched.

In response to being notified of the response information by the powered-side controller 360, the power-sourcing-side controller 150 of the first data communication device 100 performs a process of switching the electric power input to the semiconductor laser 111 for power supply.

The power-over-fiber system 1 may perform such processes.

Specifically, first, the power-sourcing-side controller 150 performs a process of determining whether to decrease or increase electric power input to the semiconductor laser 111 for power supply on the basis of the temperature (temperature information) in the power sourcing equipment 110 detected by the temperature sensor 160, and notifying the second data communication device 300, by optical communication, of the feed light switching information indicating that the output level of the feed light 112 output by the semiconductor laser 111 for power supply is to be switched (in this case, feed light switching information indicating that the output level of the feed light 112 is to decrease or feed light switching information indicating that the output level of the feed light 112 is to increase) in response to switching of the electric power input to the semiconductor laser 111 for power supply.

Then, the powered-side controller 360 performs a process of switching, on the basis of the feed light switching information which the second data communication device 300 is notified of by the power-sourcing-side controller 150, the second data communication device 300 to the low electric power mode (eco mode) in which the second data communication device 300 operates with a relatively low electric power when the output level of the feed light 112 output by the semiconductor laser 111 for power supply is to decrease and to the high electric power mode (normal mode) in which the second data communication device 300 operates with a relatively high electric power when the output level of the feed light 112 output by the semiconductor laser 111 for power supply is to increase.

After the process of switching the operation mode (eco mode/normal mode), the powered-side controller 360 performs a process of notifying the power-sourcing-side controller 150, by optical communication, of the response information indicating that the operation mode of the second data communication device 300 has been switched.

Then, in response to being notified of the response information by the powered-side controller 360, the power-sourcing-side controller 150 performs a process of switching the electric power input to the semiconductor laser 111 for power supply to perform a process of decreasing the output level of the feed light 112 output by the semiconductor laser 111 for power supply or a process of increasing the output level of the feed light 112 output by the semiconductor laser 111 for power supply.

By taking such a processing procedure, after the second data communication device 300 is switched to the operation mode corresponding to the output level of the feed light 112 supplied from the first data communication device 100 (the power sourcing equipment 110), the feed light 112 output by the semiconductor laser 111 for power supply is transmitted to the second data communication device 300 (the powered device 310). Thus, the second data communication device 300 can operate in accordance with the output level of the feed light 112.

For example, when the operation mode of the second data communication device 300 is switched after the output of the feed light 112 output by the semiconductor laser 111 for power supply is switched on the basis of the temperature in the power sourcing equipment 110 detected by the temperature sensor 160, there may be a timing when the second data communication device 300 temporarily operates in the operation mode (eco mode/normal mode) not corresponding to the output level of the feed light 112.

However, when the processing procedure of the second example is taken, the second data communication device 300 can operate in accordance with the output level of the feed light 112, which is preferable.

Also with such a configuration of the second example, as a result of switching the output level of the feed light 112 output by the semiconductor laser 111 for power supply by switching the electric power input to the semiconductor laser 111 for power supply in accordance with the temperature in the power sourcing equipment 110 detected by the temperature sensor 160, an increase in temperature in the power sourcing equipment 110 can be suppressed and the second data communication device 300 can operate in the operation mode corresponding to the output level of the feed light 112 output by the semiconductor laser 111 for power supply.

In the above-described process of switching the output level of the feed light 112 (the process of switching the electric power input to the semiconductor laser for power supply), a single boundary is determined by the predetermined threshold and the output level of the feed light is switched to decrease or increase in accordance with whether or not the temperature in the power sourcing equipment 110 detected by the temperature sensor 160 exceeds the threshold. However, the predetermined threshold may determine two boundaries by an upper-limit threshold and a lower-limit threshold instead of defining a single boundary.

In such a case, for example, when the temperature in the power sourcing equipment 110 detected by the temperature sensor 160 is equal to or higher than the upper-limit threshold, the electric power input to the semiconductor laser 111 for power supply is switched to a predetermined low electric power to switch the output level of the feed light 112 output by the semiconductor laser 111 for power supply to a low level. At this time, the second data communication device 300 is switched to a low electric power mode (eco mode) in which the second data communication device 300 operates with a relatively low electric power (for example, 100 W).

When the temperature in the power sourcing equipment 110 detected by the temperature sensor 160 is lower than the upper-limit threshold and equal to or higher than the lower-limit threshold, the electric power input to the semiconductor laser 111 for power supply is switched to a predetermined intermediate electric power to switch the output level of the feed light 112 output by the semiconductor laser 111 for power supply to an intermediate level. At this time, the second data communication device 300 is switched to an intermediate electric power mode (semi-eco mode) in which the second data communication device 300 operates with a relatively intermediate electric power (for example, 150 W).

When the temperature in the power sourcing equipment 110 detected by the temperature sensor 160 is lower than the lower-limit threshold, the electric power input to the semiconductor laser 111 for power supply is switched to a predetermined high electric power to switch the output level of the feed light 112 output by the semiconductor laser 111 for power supply to a high level. At this time, the second data communication device 300 is switched to a high electric power mode (normal mode) in which the second data communication device 300 operates with a relatively high electric power (for example, 200 W).

While the embodiments of the present disclosure have been described above, these embodiments are merely presented as examples and can be carried out in various other forms. Each component may be omitted, replaced, or modified within a range not departing from the gist of the invention.

INDUSTRIAL APPLICABILITY

The present invention can be used as a power-over-fiber system as being configured in the above-described manner.

The invention claimed is:

1. A power-over-fiber system, comprising:
a first data communication device including a power sourcing equipment, wherein the power sourcing equipment includes a semiconductor laser configured to oscillate with electric power to output feed light;
a second data communication device including a powered device and configured to perform optical communication with the first data communication device, wherein the powered device includes a photoelectric conversion element configured to convert the feed light from the power sourcing equipment into electric power;
an optical fiber cable configured to transmit the feed light from the power sourcing equipment to the powered device;
a temperature sensor configured to detect a temperature in the power sourcing equipment; and
a controller configured perform a process of switching the electric power input to the semiconductor laser, based on the temperature detected by the temperature sensor, wherein
the controller includes
a power-sourcing-side controller included in the first data communication device, and
a powered-side controller included in the second data communication device, the power-sourcing-side controller is configured to perform
a process of switching the electric power input to the semiconductor laser, based on temperature information obtained by the temperature sensor through detection, and
a process of notifying the second data communication device, by the optical communication, of feed light switching information indicating that an output level of the feed light output by the semiconductor laser is to be switched in response to switching of the electric power input to the semiconductor laser that is performed based on the temperature information, and
the powered-side controller is configured to perform a process of switching an operation mode of the second data communication device, based on the notified feed light switching information.

2. A power-over-fiber system, comprising:
a first data communication device including a power sourcing equipment, wherein the power sourcing equipment includes a semiconductor laser configured to oscillate with electric power to output feed light;
a second data communication device including a powered device and configured to perform optical communication with the first data communication device, wherein the powered device includes a photoelectric conversion element configured to convert the feed light from the power sourcing equipment into electric power;
an optical fiber cable configured to transmit the feed light from the power sourcing equipment to the powered device;
a temperature sensor configured to detect a temperature in the power sourcing equipment; and
a controller configured to perform
a process of decreasing the electric power input to the semiconductor laser in response to the temperature detected by the temperature sensor being equal to or higher than a predetermined threshold, and
a process of increasing the electric power input to the semiconductor laser in response to the temperature being lower than the predetermined threshold, wherein
the controller includes
a power-sourcing-side controller included in the first data communication device, and
a powered-side controller included in the second data communication device, the power-sourcing-side controller is configured to perform
a process of switching the electric power input to the semiconductor laser, based on temperature information obtained by the temperature sensor through detection, and
a process of notifying the second data communication device, by the optical communication, of feed light switching information indicating that an output level of the feed light output by the semiconductor laser is to be switched in response to switching of the electric power input to the semiconductor laser that is performed based on the temperature information, and
the powered-side controller is configured to perform a process of switching an operation mode of the second data communication device, based on the notified feed light switching information.

3. The power-over-fiber system according to claim 1, wherein the powered-side controller is configured to perform a process of notifying the power-sourcing-side controller, by the optical communication, of response information indicating that the operation mode of the second data communication device has been switched based on the feed light switching information, and
wherein in response to being notified of the response information, the power-sourcing-side controller is configured to perform a process of switching the electric power input to the semiconductor laser.

4. The power-over-fiber system according to claim 1, wherein
a semiconductor material of a semiconductor region that exhibits a light-electricity conversion effect of the semiconductor laser is a laser medium having a laser wavelength of 500 nm or shorter.

5. The power-over-fiber system according to claim 1, wherein
a semiconductor material of a semiconductor region that exhibits a light-electricity conversion effect of the photoelectric conversion element is a laser medium having a laser wavelength of 500 nm or shorter.

* * * * *